United States Patent
Masuda

(10) Patent No.: US 8,659,750 B2
(45) Date of Patent: Feb. 25, 2014

(54) TEST APPARATUS, TEST METHOD, AND DEVICE INTERFACE

(75) Inventor: Shin Masuda, Miyagi (JP)

(73) Assignee: Advantest Corporation, Tokyo (JP)

(*) Notice: Subject to any disclaimer, the term of this patent is extended or adjusted under 35 U.S.C. 154(b) by 121 days.

(21) Appl. No.: 13/040,161

(22) Filed: Mar. 3, 2011

(65) Prior Publication Data

US 2011/0279811 A1 Nov. 17, 2011

(30) Foreign Application Priority Data

May 17, 2010 (JP) .................................. 2010-113501

(51) Int. Cl.
*G01N 21/00* (2006.01)

(52) U.S. Cl.
USPC ............................................................ 356/72

(58) Field of Classification Search
USPC .................................................. 356/72, 218
See application file for complete search history.

(56) References Cited

U.S. PATENT DOCUMENTS

| | | | | |
|---|---|---|---|---|
| 6,045,655 | A * | 4/2000 | DiStefano et al. | 156/324.4 |
| 2008/0118202 | A1 | 5/2008 | Kato et al. | |
| 2010/0239155 | A1* | 9/2010 | Ichikawa et al. | 382/141 |

FOREIGN PATENT DOCUMENTS

| | | |
|---|---|---|
| JP | H9-145961 | 6/1997 |
| JP | 2003194880 | 7/2003 |
| WO | 2007/013128 A1 | 2/2007 |

OTHER PUBLICATIONS

Young et al., "Optical I/O Technology for Tera-Scale Computing", IEEE Journal of Solid-State Circuits, Jan. 2010. vol. 45, No. 1, pp. 235-248. Mentioned on p. 1 of the as-filed specification.
Thacker et al., "Prospects for Wafer-Level Testing of Gigascale Chips with Electrical and Optical I/O Interconnects", IEEE International Test Conference, 2006, Paper 25-1, pp. 1-7. Mentioned on p. 1 of the as-filed specification.
Applicant brings the attention of the Examiner to the following pending U.S. applications; U.S. Appl. No. 13/038,344, filed Mar. 1, 2011 and U.S. Appl. No. 13/041,294, filed Mar. 4, 2011.
JP Office Action/ Search Report and Computer Translation Dated Mar. 12, 2013; Application No. 2010-113501.

* cited by examiner

*Primary Examiner* — Tarifur Chowdhury
*Assistant Examiner* — Abdullahi Nur

(57) ABSTRACT

Provided is a test apparatus that tests a device under test including an optical coupler for transmitting optical signals in a surface direction and a first groove for holding an optical transmission path connected to the optical coupler. The test apparatus comprises a substrate on which the device under test is to be loaded; an optical transmission path to be connected to the optical coupler; and a pressing section that presses the optical transmission path from the substrate side toward the first groove. Also provided is a test method.

17 Claims, 4 Drawing Sheets

TEST APPARATUS, TEST METHOD, AND DEVICE INTERFACE

BACKGROUND

1. Technical Field

The present invention relates to a test apparatus, a test method, and a device interface.

2. Related Art

Conventionally, a test apparatus is used to test a device under test such as a CPU or a memory. The device under test can be provided with an optical interface, as shown in Patent Document 1 and Non-Patent Documents 1 and 2, for example.

Patent Document 1: International Publication WO 2007/013128

Non-Patent Document 1: Ian A. Young, et al., "Optical I/O Technology for Tera-Scale Computing", IEEE Journal of Solid-State Circuits, January 2010, Vol. 45, No. 1, pp. 235-248

Non-Patent Document 2: Hiren D. Thacker, James D. Meindl, "Prospects for Wafer-Level Testing of Gigascale Chips with Electrical and Optical I/O Interconnects", IEEE International Test Conference, 2006, 25-1

When testing a device under test having an optical interface, an optical signal must be used as the test signal and input to an optical input section of the device under test, and the optical response signal output from an optical output section of the device under test must be detected. The test apparatus requires accurate adjustment of the optical axis of the optical input and output, and this decreases the throughput of the testing while increasing the testing cost. Furthermore, one method for testing a device under test provided with an optical interface includes testing of a package including an optical fiber. In this case, if the device under test does not perform as desired, the package must be rejected along with the device under test, thereby increasing the manufacturing cost.

SUMMARY

Therefore, it is an object of an aspect of the innovations herein to provide a test apparatus, a test method, and a device interface, which are capable of overcoming the above drawbacks accompanying the related art. The above and other objects can be achieved by combinations described in the independent claims. According to a first aspect related to the innovations herein, provided is a test apparatus that tests a device under test including an optical coupler for transmitting optical signals in a surface direction and a first groove for holding an optical transmission path connected to the optical coupler. The test apparatus comprises a substrate on which the device under test is to be loaded; an optical transmission path to be connected to the optical coupler; and a pressing section that presses the optical transmission path from the substrate side toward the first groove. Also provided is a test method.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
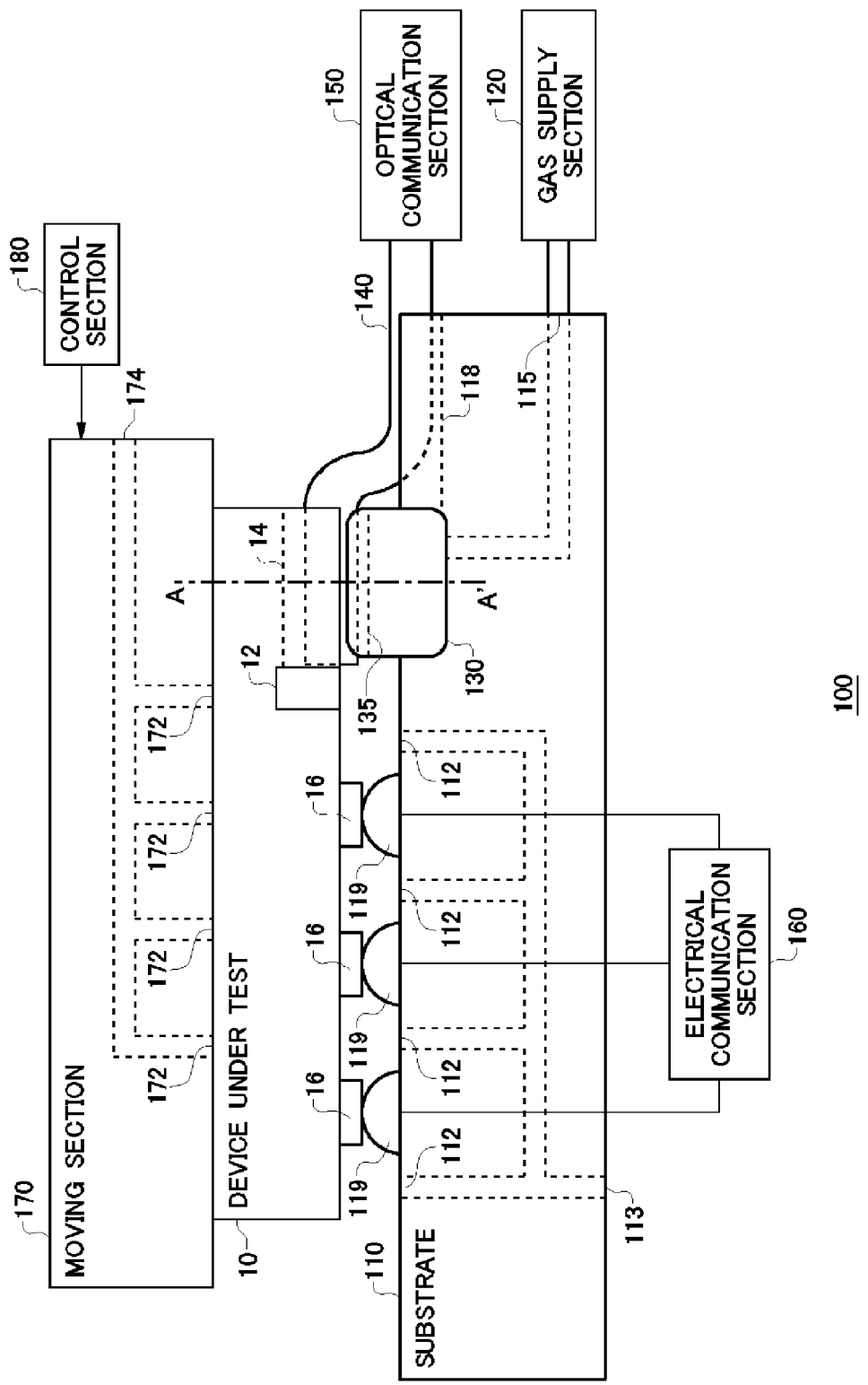
FIG. 1 shows an exemplary configuration of an interface between a device under test 10 and a test apparatus 100, according to an embodiment of the present invention.

FIG. 1 shows an exemplary configuration of an interface between a device under test 10 and a test apparatus 100, according to an embodiment of the present invention. The test apparatus 100 exchanges optical signals and electrical signals with the device under test 10 having an optical interface to test the device under test 10, which may be an analog circuit, a digital circuit, a memory, or a system on chip (SOC), for example. The device under test 10 includes a first groove 14 and an optical coupler 12 for transmitting optical signals in a surface direction. The device under test 10 may include terminals 16.

The optical coupler 12 transmits optical signals in the surface direction. The optical coupler 12 may be optically coupled to an optical transmission path formed on the surface of the device under test 10, for example, and exchange optical signals between the optical transmission path of the device under test 10 and an external optical transmission path. The optical coupler 12 may exchange optical signals input to or output from an end of an optical fiber arranged at a predetermined position. The position where the end of the optical fiber is to be arranged may be determined in advance according to the number of openings, core shape, and core dimensions of the optical coupler 12 and the core diameter and number of openings of an external optical fiber, for example.

The first groove 14 holds the optical transmission path connected to the optical coupler 12. The first groove 14 may be provided to arrange the external optical fiber at the predetermined position to connect the optical fiber to the optical coupler 12. The first groove 14 may be a V-shaped groove having a width and depth corresponding to a predetermined diameter of the optical fiber. Instead, the first groove 14 may be a groove having a width and a depth corresponding to a predetermined shape of a substrate on which a waveguide is formed.

The terminals 16 transmit electrical signals. The terminals 16 may be solder bumps, lands, or connectors, for example. The terminals 16 may include one or more input terminals and one or more output terminals for inputting and outputting electrical signals.

The device under test 10 is loaded in the test apparatus 100 in order for the test apparatus 100 to exchange electrical and optical signals with the device under test 10. The test apparatus 100 includes a substrate 110, a gas supplying section 120, a pressing section 130, an optical transmission path 140, an optical communication section 150, an electrical communication section 160, a moving section 170, and a control section 180.

The device under test 10 is loaded on the substrate 110. The substrate 110 includes adhering units 112, a suction unit 113, a gas injecting section 115, and a second groove 118. The substrate 110 may include electrodes 119 for exchanging electrical signals with the device under test 10.

The adhering units 112 exert suction to adhere the device under test 10 thereto. The adhering units 112 may be formed on the top surface of the substrate 110 to physically contact the device under test 10 and exert suction to adhere the device under test 10 thereto. By sealing the space between the device under test 10 and the substrate 110, the adhering units 112 can adhere the device under test 10 thereto by exerting suction in the sealed space. The suction unit 113 is connected to a pump, for example, to expel air from the adhering units 112 or the atmospheric gas above the substrate 110.

The gas injecting section 115 is connected to the gas supplying section 120, and supplies the pressing section 130 with gas received from the gas supplying section 120. The second groove 118 holds the optical transmission path 140. If the optical transmission path 140 is an optical fiber, the second groove 118 may be a V-shaped groove with a width and depth corresponding to the diameter of the optical fiber. If the optical transmission path 140 is a waveguide, the second groove 118 may be a groove with a width and depth corresponding to the shape of the substrate on which the waveguide is formed.

The electrodes 119 are connected to the electrical communication section 160, and contact the terminals 16 of the device under test 10. The electrodes 119 may be terminals, probes, cantilevers, or membranes that directly contact the terminals 16, for example. If the terminals 16 are connectors, the electrodes 119 may be connectors that engage with the terminals 16. The substrate 110 may have a number of electrodes 119 greater than or equal to the number of terminals 16 of the device under test 10.

The gas supplying section 120 supplies gas to the pressing section 130 via the gas injecting section 115. The gas supplying section 120 may be attached via piping to a gas cylinder storing high-pressure gas, for example, and a valve in the piping can be opened or closed to supply the pressing section 130 with high-pressured gas. The gas supplied by the gas supplying section 120 may be air, nitrogen, or argon, for example. Instead, the gas supplying section 120 may supply a liquid such as water.

The pressing section 130 presses the optical transmission path 140 from the substrate side toward the first groove 14. The pressing section 130 may be made of metal, resin, ceramic, or an elastic material such as rubber. The pressing section 130 is pressed upward by the gas pressure or fluid pressure supplied from the gas supplying section 120. Instead, the pressing section 130 may be an elastic film made of rubber, for example, and attached to the substrate 110. In this case, the pressing section 130 is filled by the gas supplied from the gas supplying section 120 to expand, thereby pressing the optical transmission path 140 toward the first groove 14. As another example, the pressing section 130 may be mechanically moved by a piezoelectric actuator.

The pressing section 130 may be provided with a third groove 135 that holds the optical transmission path 140, for example. If the optical transmission path 140 is an optical fiber, the third groove 135 may be a V-shaped groove with a width and depth corresponding to the diameter of the optical fiber. If the optical transmission path 140 is an optical waveguide, the third groove 135 may be a groove with a width and depth corresponding to the shape of the substrate on which the optical waveguide is formed. In this way, the pressing section 130 can press the optical transmission path 140 toward the first groove 14 while holding the optical transmission path 140.

The depth of the third groove 135 may be less than the depth of the first groove 14. As a result, even when the first groove 14 and the third groove 135 are skewed from the positions where they hold the optical transmission path 140, the pressing section 130 can press the optical transmission path 140 to give priority to the position where the optical transmission path 140 is arranged when held by the first groove 14.

The optical transmission path 140 is connected to the optical coupler 12 of the device under test 10. The optical transmission path 140 may include a number of optical fibers equal to the number of optical couplers 12 of the device under test 10. In this case, the optical transmission path 140 may be bent in a manner to be arranged in advance parallel to the first groove 14. As a result, when pressed by the pressing section 130, the optical transmission path 140 can easily be inserted into the first groove 14 and can be positioned to contact the optical coupler 12.

The optical transmission path 140 may include a number of waveguides equal to the number of optical couplers 12 formed on the substrate. In this case, in the optical transmission path 140, optical couplers may be formed on the ends of the optical waveguides that are substantially the same as the optical couplers 12 of the device under test 10, so that optical signals can be exchanged by optically connecting the optical couplers to each other.

When the device under test 10 is loaded on the substrate 110, diameter of the optical transmission path 140 is less than the interval between the bottom surface of the device under test 10 and the substrate 110. For example, an optical transmission path 140 that transmits light in a communication band with a wavelength of approximately 1550 nm has a core diameter of approximately 10 µm, and when covered by a UV-curable resin or the like has an outer diameter of approximately 250 µm to 400 µm. Accordingly, the optical transmission path 140 preferably has a positional accuracy for the optical connection between the device under test 10 and the optical coupler with an error of less than 1 µm.

Therefore, the device under test 10 is provided with a first groove 14 that can achieve positional accuracy with an error of less than 1 µm. As long as the position of the device under test 10 pressing the optical transmission path 140 is at least within the range of the first groove 14, the test apparatus 100 can arrange the optical transmission path 140 with the necessary accuracy. In other words, the test apparatus 100 allows arrangement of the substrate 110 and the device under test 10 with a positional accuracy having an error greater than 1 µm. Therefore, the space between the lower surface of the device under test 10 and the substrate 110 is allowed to be greater than the diameter of the optical transmission path 140, and the relative positions of the device under test 10 and the substrate 110 are allowed to be moved with a positional accuracy error greater than 1 µm.

The optical communication section 150 is connected to the optical coupler 12 of the device under test 10 via the optical transmission path 140, and transfers optical signals to and from the device under test 10. The optical communication section 150 may be loaded on the substrate 110, or may instead be loaded on a separate substrate. The optical communication section 150 may convert the electrical test signal supplied to the device under test 10 into an optical signal and convert the optical response signal received from the device under test 10 into an electrical response signal.

The electrical communication section 160 transfers electrical signals to and from the device under test 10. The electrical communication section 160 may be loaded on the substrate 110, or may instead be loaded on the test apparatus 100 as a separate substrate. The electrical communication section 160 may provide the device under test 10 with supply power.

The electrical communication section 160 may supply the device under test 10 with a test signal and/or a clock signal whose frequency is lower than that of the optical test signal.

The moving section 170 adheres the device under test 10 thereto, moves the device under test 10, and loads the device under test 10 on the substrate 110. The moving section 170 includes adhering units 172 and a suction unit 174. The adhering units 172 are formed on the surface of the moving section 170, and physically contact the device under test 10 to adhere the device under test 10 thereto via suction. The suction unit 174 is connected to a pump, for example, to expel air or atmospheric gas from the adhering units 172. The moving section 170 has an XYZθ stage, for example, that moves according to a control signal from the control section 180.

The control section 180 causes the moving section 170 to move by transmitting the control signal to the moving section 170, thereby controlling the relative positions of the device under test 10 and the substrate 110. The control section 180 may detect the movement amount of the moving section 170 using a sensor, for example, to acquire the relative positions of the device under test 10 and the substrate 110. For example, the substrate 110 or the moving section 170 may be made of glass or silicon, which transmits infrared light, and the test apparatus 100 may emit infrared light toward the device under test 10 from above the moving section 170 or from below the substrate 110. The control section 180 may acquire the relative positions of the device under test 10 and the substrate 110 by detecting the reflected light or transmitted light resulting from infrared light being emitted toward the device under test 10 and passing through the substrate 110 or the moving section 170.

The substrate 110 and/or the moving section 170 may include an alignment mark on which the infrared light is to be irradiated. The control section 180 may align the positions of the substrate 110 and/or the moving section 170 by detecting the position of the substrate 110 or the moving section 170 whose alignment mark is irradiated with infrared light.

Figure 2:
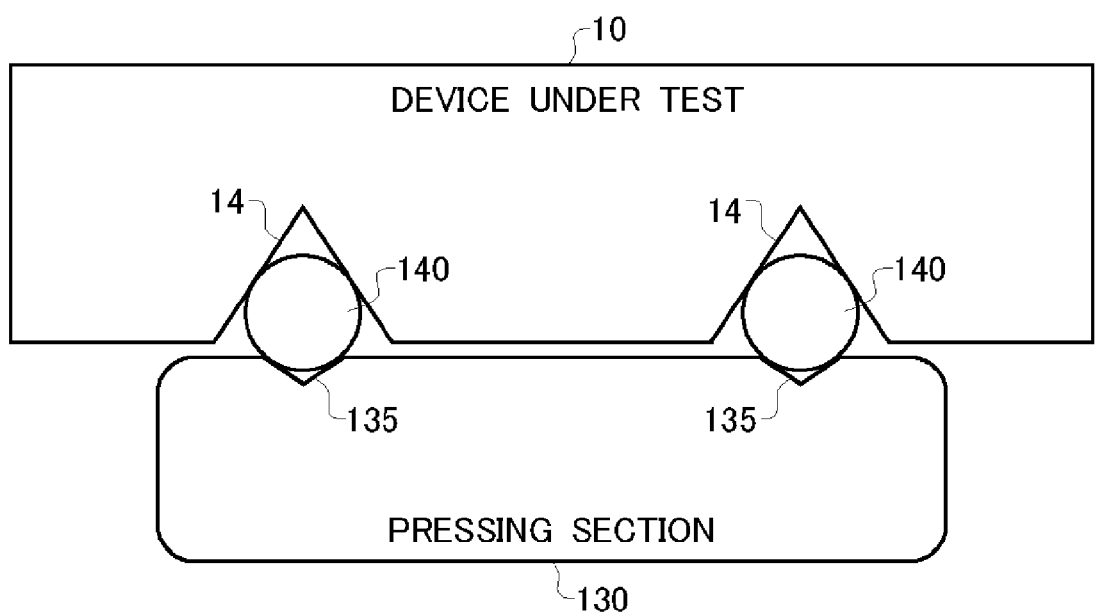
FIG. 2 shows an exemplary configuration of a cross-section over the line A-A' shown in FIG. 1.

FIG. 2 shows an exemplary configuration of a cross-section over the line A-A' shown in FIG. 1. In this example, the device under test 10 is loaded on the substrate 110. Furthermore, the device under test 10 includes two optical couplers 12 and two first grooves 14 corresponding to the two optical couplers 12. The first grooves 14 and the third grooves 135 are V-shaped grooves holding the optical transmission paths 140, and the depth of the third grooves 135 is less than the depth of the first grooves 14.

The pressing section 130 presses the optical transmission paths 140 from the substrate side toward the first grooves 14 using gas pressure or liquid pressure, such that the optical transmission paths 140 are held by the first grooves 14 to be in positions enabling optical connection with the optical couplers 12. In this example, the device under test 10 includes two optical couplers 12 and two first grooves 14, but the device under test 10 may instead include two or more optical couplers 12 or two or more first grooves 14. Furthermore, the test apparatus 100 of the present example includes one pressing section 130 to press the optical transmission paths 140 against the first grooves 14, but the test apparatus 100 may instead include a plurality of pressing sections 130.

Figure 3:
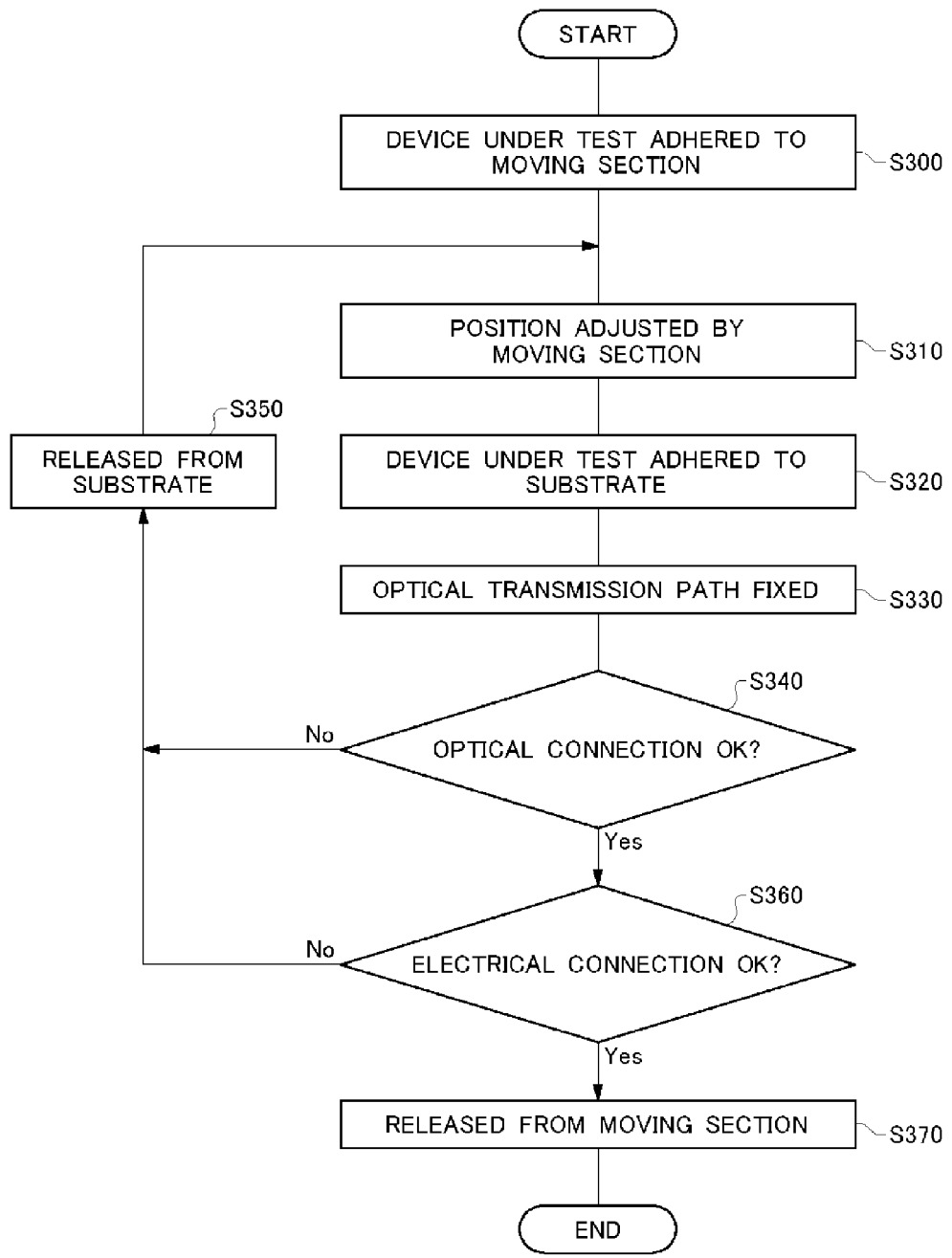
FIG. 3 shows a process flow of the test apparatus 100 according to the present embodiment.

FIG. 3 shows a process flow of the test apparatus 100 according to the present embodiment. The test apparatus 100 adheres the device under test 10 to the moving section 170 (S300). At this time, the test apparatus 100 may align the relative positions of the moving section 170 and the substrate 110. The control section 180 transmits the control signal to the moving section 170 to move the moving section 170 to a position where the device under test 10 is to be loaded on the substrate 110 (S310).

The test apparatus 100 may electrically connect the terminals 16 of the device under test 10 to the electrodes 119 of the substrate 110 while pressing the optical coupler 12 of the device under test 10 against the optical transmission path 140. When optically and electrically connecting to the device under test 10, the test apparatus 100 physically connects the terminals 16 of the device under test 10 to the electrodes 119 of the substrate 110 and optically connects the optical coupler 12 to the optical transmission path 140. The test apparatus 100 moves the optical transmission path 140 with the pressing section 130 such that the device under test 10 is within a range that enables an optical connection between the optical transmission path 140 and the optical coupler 12, and connects the terminals 16 and the gas injecting section 115.

Next, the test apparatus 100 adheres the device under test 10 to the substrate 110 (S320). In this way, the test apparatus 100 loads the device under test 10 onto the substrate 110 while maintaining an electrical connection. After the test apparatus 100 loads the device under test 10 onto the substrate 110, the pressing section 130 presses the optical transmission path 140 from the substrate 110 side toward the first groove 14, thereby fixing the optical transmission path 140 (S330).

The test apparatus 100 tests the optical connection (S340). The test apparatus 100 generates an optical signal for the connection test using the optical communication section 150, supplies this optical signal to the device under test 10, receives the optical response signal output by the device under test 10 using the optical communication section 150, and tests the optical connection between the device under test 10 and the test apparatus 100 based on the strength of the received optical signal. If an optical signal with a prescribed strength is supplied and the strength of the received optical signal is less than or equal to a predetermined strength, for example, the test apparatus 100 may judge the optical connection to be a failure.

When the optical connection is a failure, the test apparatus 100 changes the position of the device under test 10. In other words, the test apparatus 100 dissolves the adhesion exerted on the device under test 10 by the adhering units 112 of the substrate 110 (S350). The test apparatus 100 then returns to step S310 and again performs the process of using the moving section 170 to load the device under test 10 on the substrate 110. The test apparatus 100 may repeat the processes from step S310 to step S350 until the test of the optical connection results in success.

If the optical connection test results do not indicate success even after repeated loadings of the device under test 10, the test apparatus 100 may judge the device under test 10 to be unacceptable. For example, if the connection test results indicate failure even after a predetermined number of repeated loadings of the device under test 10, the test apparatus 100 may judge the optical interface of the device under test 10 or the relative positions of the optical interface and the electrical interface to be unacceptable, and end the testing of the device under test 10.

When the optical connection test of the device under test 10 results in success, the test apparatus 100 tests the electric connection of the device under test 10 (S360). The test apparatus 100 supplies the terminals 16, via the electrodes 119, with a predetermined electrical signal from the electrical communication section 160, such as an electrical signal having a predetermined pattern or H/L logic values. The test apparatus 100 receives the response signals output by the terminals 16 via the electrodes 119 at the electrical communication section 160 to test the connection state of the electrical signals.

For example, the test apparatus 100 may judge the connection state to be successful when a prescribed voltage is supplied by the electrical communication section 160 as the predetermined electrical signal and the electrical communication section 160 receives a voltage value within a predetermined range. If a successful connection is not detected, the test apparatus 100 changes the position of the device under test 10. In other words, the test apparatus 100 dissolves the adhesion exerted on the device under test 10 by the adhering units 112 of the substrate 110 (S350). The test apparatus 100 then returns to step S310 and again performs the process of using the moving section 170 to load the device under test 10 on the substrate 110. The test apparatus 100 may repeat the processes from step S310 to step S350 until the test of the electrical connection results in success.

If the electrical connection test results do not indicate success even after repeated loadings of the device under test 10, the test apparatus 100 may judge the device under test 10 to be unacceptable. For example, if the electrical connection test results indicate failure even after a predetermined number of repeated loadings of the device under test 10, the test apparatus 100 may judge the electrical interface of the device under test 10 to be unacceptable, and end the testing of the device under test 10.

When the electrical connection test of the device under test 10 results in success, the test apparatus 100 ends testing of the connections between the device under test 10 and the substrate 110, and dissolves the adhesion of the moving section 170 (S370). With the embodiment described above, the test apparatus 100 can obtain successful optical and electrical connections between the device under test 10 and the substrate 110, and therefore the device under test 10 can be loaded on the substrate 110 without a precise optical axis adjustment of the optical input and output. After this, the test apparatus 100 begins an operational test of the device under test 10.

In the present embodiment, the test apparatus 100 fixes the optical transmission path 140 after the device under test 10 is adhered to the substrate 110. Instead, the test apparatus 100 may fix the optical transmission path 140 and then adhere the device under test 10 to the substrate 110.

In the present embodiment, the test apparatus 100 loads the device under test 10, performs the optical connection test, and then the electrical connection test. Instead, the test apparatus 100 may load the device under test 10, perform the electrical connection test, and then perform the optical connection test after receiving a successful result for the electrical connection test. In this case, the test apparatus 100 may load the device under test 10 and then fix the optical transmission path 140, or may fix the optical transmission path 140 after the electrical connection test. For example, the test apparatus 100 can shorten the testing time of the device under test 10 by performing whichever of the electrical connection test and the optical connection test is expected to have more failures first.

Figure 4:
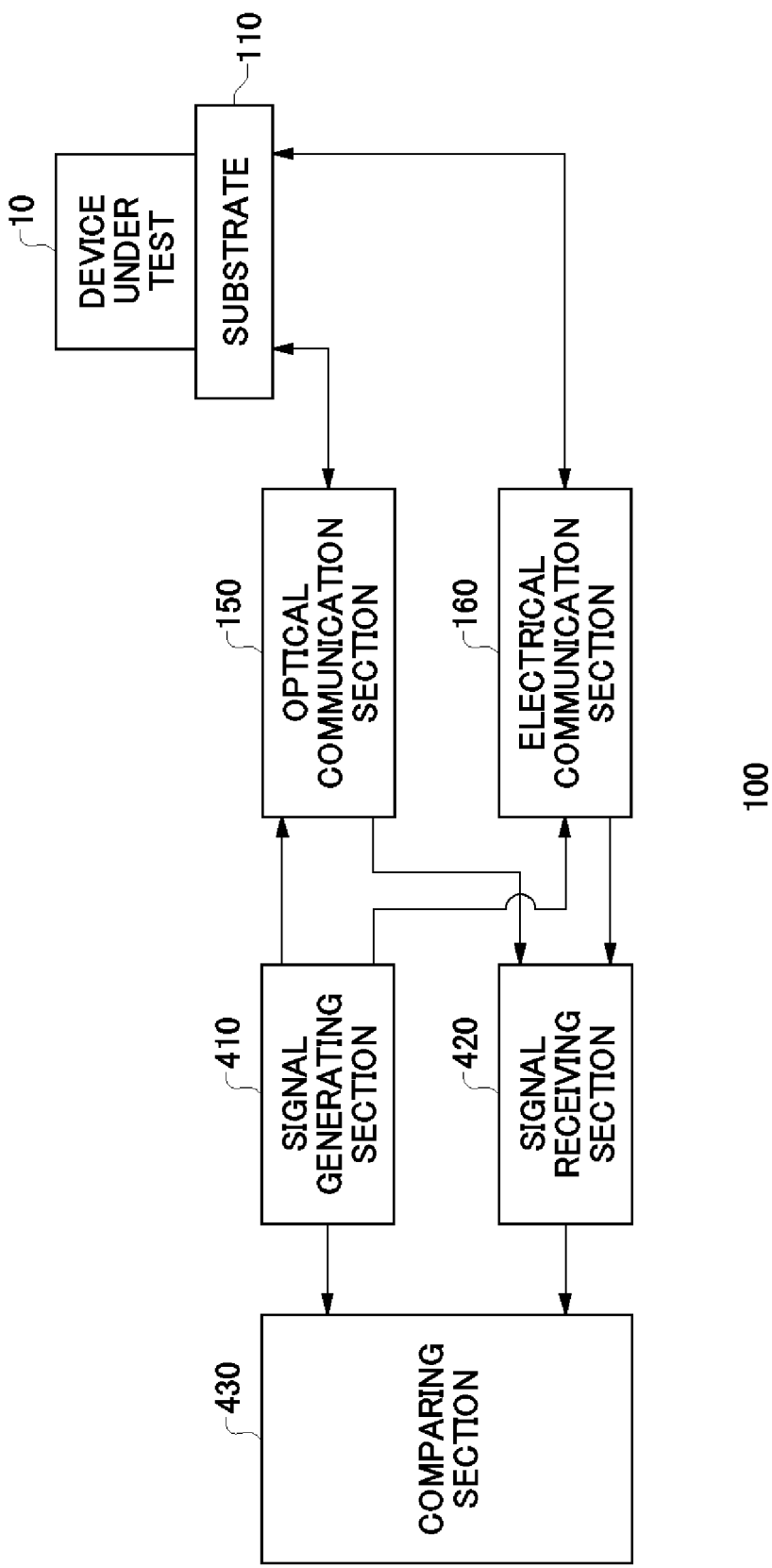
FIG. 4 shows an exemplary configuration of a test apparatus 100 according to an embodiment of the present invention, along with a device under test 10.

FIG. 4 shows an exemplary configuration of a test apparatus 100 according to an embodiment of the present invention, along with a device under test 10. Components of the test apparatus 100 of the present embodiment that have substantially the same operation as components in the test apparatus 100 shown in FIG. 1 are given the same reference numerals and further description is omitted. The test apparatus 100 exchanges optical signals and electrical signals with the device under test 10 having an optical coupler for transmitting optical signals in a surface direction, to test the device under test 10, which may be an analog circuit, a digital circuit, an analog/digital mixed circuit, a memory, or a system on chip (SOC), for example.

The test apparatus 100 supplies the device under test 10 with a test signal based on a test pattern for testing the device under test 10, and judges pass/fail of the device under test 10 based on the output signal output by the device under test 10 in response to the test signal. Test signals supplied to the device under test 10 by the test apparatus 100 may be electric signals and/or optical signals, and the output signals output by the device under test 10 may also be electric signals and/or optical signals. The test apparatus 100 further includes a signal generating section 410, a signal receiving section 420, and a comparing section 430.

The signal generating section 410 generates a plurality of test signals to be supplied to the device under test 10, according to a test program. The signal generating section 410 transmits test signals to the optical communication section 150 when supplying optical test signals to the device under test 10. The optical communication section 150 supplies the device under test 10 with the optical test signals obtained by performing an electro-optical conversion on the received test signals. The signal generating section 410 transmits test signals to the optical communication section 150 when supplying electrical test signals to the device under test 10. The optical communication section 150 supplies the device under test 10 with the received test signals. The signal generating section 410 may generate expected values for response signals output by the device under test 10 in response to the test signals, and transmit the expected values to the comparing section 430.

When an optical response signal output by the device under test 10 in response to an electrical or optical test signal is received, the optical communication section 150 transmits to the signal receiving section 420 a response signal obtained by performing an optical-electro conversion on the optical response signal. When an electrical response signal output by the device under test 10 in response to an electrical or optical test signal is received, the optical communication section 150 transmits the received response signal to the signal receiving section 420. The signal receiving section 420 may transmit the received response signal to the comparing section 430. The signal receiving section 420 may record the received response signal in a recording apparatus.

The comparing section 430 compares the response signal received from the comparing section 430 to the expected value received from the signal generating section 410. The test apparatus 100 may judge pass/fail of the device under test 10 based on the comparison result by the comparing section 430. In this way, the test apparatus 100 can test a device under test 10 including an optical coupler by exchanging optical signals and electrical signals with the device under test 10. Furthermore, the test apparatus 100 can exchange test signals and response signals with the device under test 10 at high speed, by transmitting high-frequency signals over several hundred MHz, which are difficult to send as electric signals, as optical signals. In this way, the test apparatus 100 can test the device under test 10 while causing the device under test 10 to operate at its actual operating speed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test including an optical coupler for transmitting optical signals in a surface direction and a first groove for holding an optical transmission path connected to the optical coupler, the test apparatus comprising:
    a substrate on which the device under test is to be loaded;
    an optical transmission path to be connected to the optical coupler; and
    a pressing section that presses the optical transmission path from the substrate side toward the first groove.

2. The test apparatus according to claim 1, further comprising an optical communication section that is connected to the optical coupler of the device under test via the optical transmission path and that transmits optical signals to and from the device under test.

3. The test apparatus according to claim 1, wherein the device under test further includes a terminal for transmitting electrical signals, the test apparatus further comprises an electrical communication section that transmits electrical signals to and from the device under test, and the substrate includes an electrode that is connected to the electrical communication section and that contacts the terminal.

4. The test apparatus according to claim 3, wherein the test apparatus loads the device under test on the substrate by electrically connecting the terminal of the device under test to the electrode of the substrate while pressing the optical coupler of the device under test against the optical transmission path.

5. The test apparatus according to claim 4, wherein after the device under test is loaded on the substrate, the pressing section presses the optical transmission path from the substrate side toward the first groove, the test apparatus tests an optical connection, and, when the optical connection is a failure, the test apparatus changes position of the device under test.

6. The test apparatus according to claim 1, wherein the pressing section performs the pressing using gas pressure.

7. The test apparatus according to claim 1, wherein the substrate includes an adhering unit that exerts suction on the device under test to adhere the device under test thereto.

8. The test apparatus according to claim 1, further comprising a moving section that adheres the device under test thereto, moves the device under test, and loads the device under test on the substrate.

9. The test apparatus according to claim 1, wherein the optical transmission path is bent in a manner to be prearranged parallel to the first groove.

10. The test apparatus according to claim 1, wherein the substrate includes a second groove that holds the optical transmission path.

11. The test apparatus according to claim 1, wherein the pressing section includes a third groove that holds the optical transmission path.

12. The test apparatus according to claim 11, wherein depth of the third groove is less than depth of the first groove.

13. The test apparatus according to claim 1, wherein when the device under test is loaded on the substrate, diameter of the optical transmission path is less than distance between a bottom surface of the device under test and the substrate.

14. The test apparatus according to claim 1, wherein the device under test includes a plurality of optical couplers and a plurality of first grooves corresponding to the plurality of optical couplers, the test apparatus comprises a plurality of optical transmission paths to be connected respectively to the optical couplers, and the pressing section presses the optical transmission paths from the substrate side toward the first grooves.

15. The apparatus according to claim 1, wherein the optical transmission path is one of an optical fiber and a waveguide.

16. A test method for testing a device under test that includes an optical coupler for transmitting optical signals in a surface direction and a groove for holding an optical transmission path connected to the optical coupler, the test method comprising:
    loading a device under test onto the substrate;
    connecting an optical transmission path to the optical coupler; and
    pressing the optical transmission path from the substrate side toward the groove.

17. A device comprising:
    a substrate on which a device under test is to be loaded, the device under test including an optical coupler for transmitting optical signals and a groove,
    an optical transmission path to be inserted into the groove and connected to the optical coupler; and
    a pressing section that presses the optical transmission path from the substrate side toward the groove.

* * * * *